US008786307B2

(12) United States Patent
Jain

(10) Patent No.: US 8,786,307 B2
(45) Date of Patent: Jul. 22, 2014

(54) BIAS TEMPERATURE INSTABILITY-RESISTANT CIRCUITS

(75) Inventor: Palkesh Jain, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 13/493,371

(22) Filed: Jun. 11, 2012

(65) Prior Publication Data

US 2013/0002327 A1 Jan. 3, 2013

Related U.S. Application Data

(60) Provisional application No. 61/502,141, filed on Jun. 28, 2011.

(51) Int. Cl.
*H03K 19/003* (2006.01)
(52) U.S. Cl.
CPC ............... *H03K 19/00315* (2013.01)
USPC .......................................... 326/9
(58) Field of Classification Search
USPC .......................................... 326/9
See application file for complete search history.

(56) References Cited

U.S. PATENT DOCUMENTS

| 4,800,300 | A | * | 1/1989 | Walters, Jr. | 327/210 |
|---|---|---|---|---|---|
| 5,164,612 | A | * | 11/1992 | Kaplinsky | 327/108 |
| 5,306,965 | A | * | 4/1994 | Asprey | 326/83 |
| 5,841,702 | A | * | 11/1998 | Kim | 365/189.05 |
| 5,867,039 | A | * | 2/1999 | Golke | 326/81 |
| 5,867,049 | A | * | 2/1999 | Mohd | 327/200 |
| 6,060,921 | A | * | 5/2000 | Daniell | 327/170 |
| 6,097,207 | A | * | 8/2000 | Bernstein et al. | 326/9 |
| 6,686,763 | B1 | * | 2/2004 | Yen | 326/30 |
| 6,977,528 | B2 | * | 12/2005 | Kang et al. | 326/121 |
| 7,282,377 | B2 | * | 10/2007 | Muranaka | 438/18 |
| 7,679,399 | B2 | * | 3/2010 | Madurawe | 326/38 |
| 7,839,173 | B1 | * | 11/2010 | Zhang et al. | 326/81 |
| 7,948,261 | B2 | * | 5/2011 | Kawakami | 326/12 |
| 8,330,534 | B2 | * | 12/2012 | Zhai et al. | 327/543 |
| 2011/0267107 | A1 | * | 11/2011 | Chern et al. | 326/121 |
| 2012/0069684 | A1 | * | 3/2012 | Douzaka et al. | 365/189.05 |

* cited by examiner

*Primary Examiner* — Thomas J Hiltunen
(74) *Attorney, Agent, or Firm* — Mirna Abyad; Frederick J. Telecky, Jr.

(57) ABSTRACT

Standard cells that include transistors subject to aging as a result of BTI-related operating conditions are identified and replaced with BTI-resistant standard cells, for example. The BTI-resistant standard cells are typically functionally equivalent circuits (such as circuits included in standard cells in a design library) and are arranged to ensure that critical transistors are protected (e.g., by either extending recovery times and/or turning the transistor off in response to a critical edge transition).

16 Claims, 8 Drawing Sheets

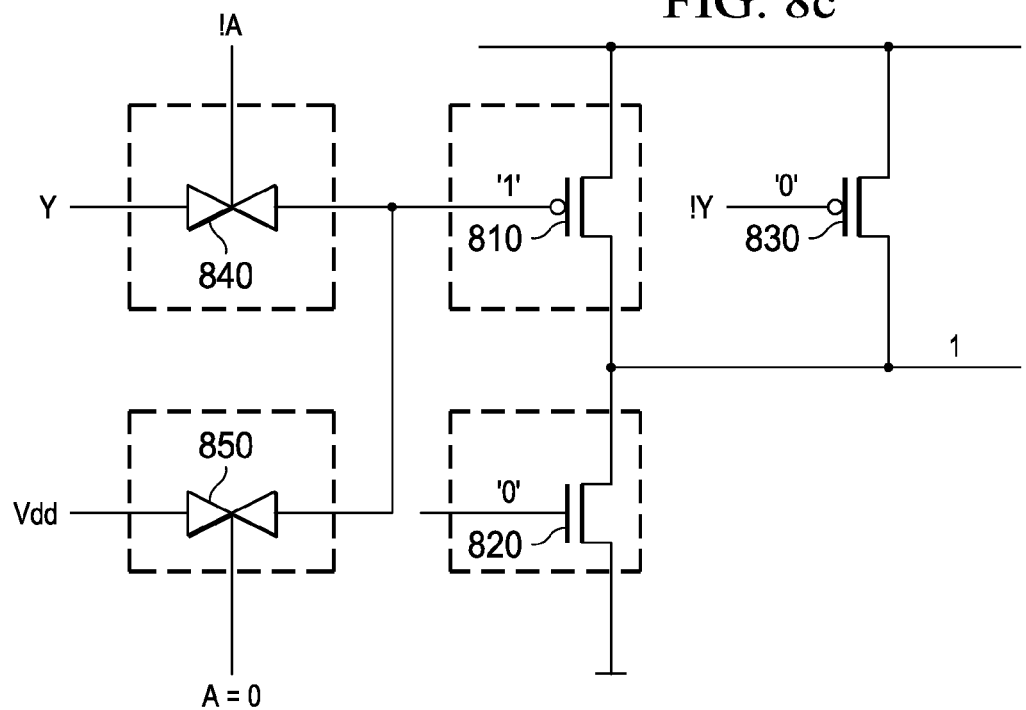
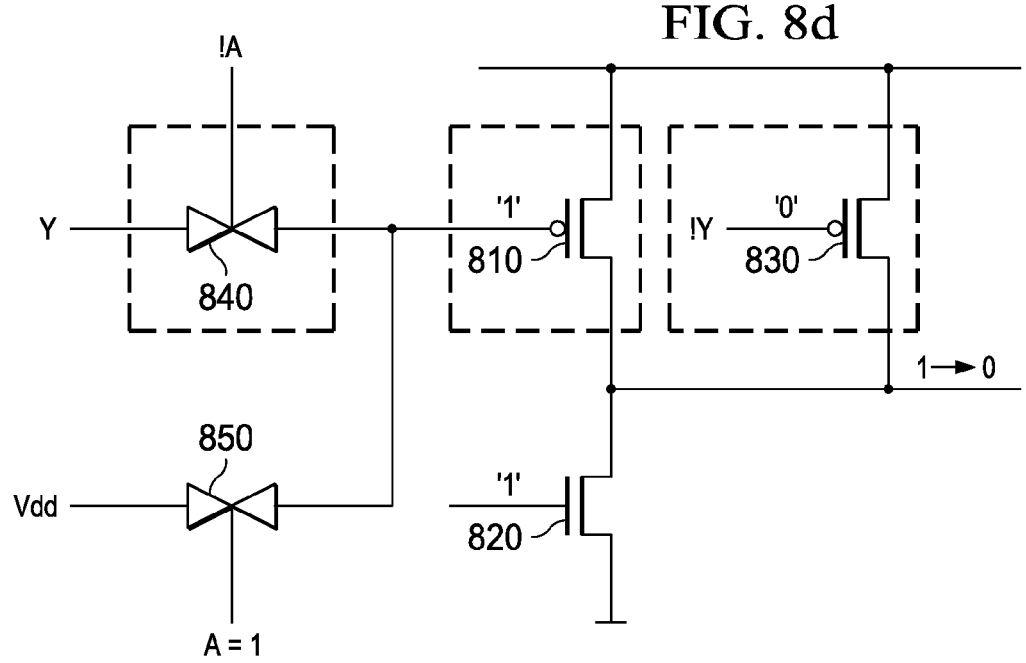

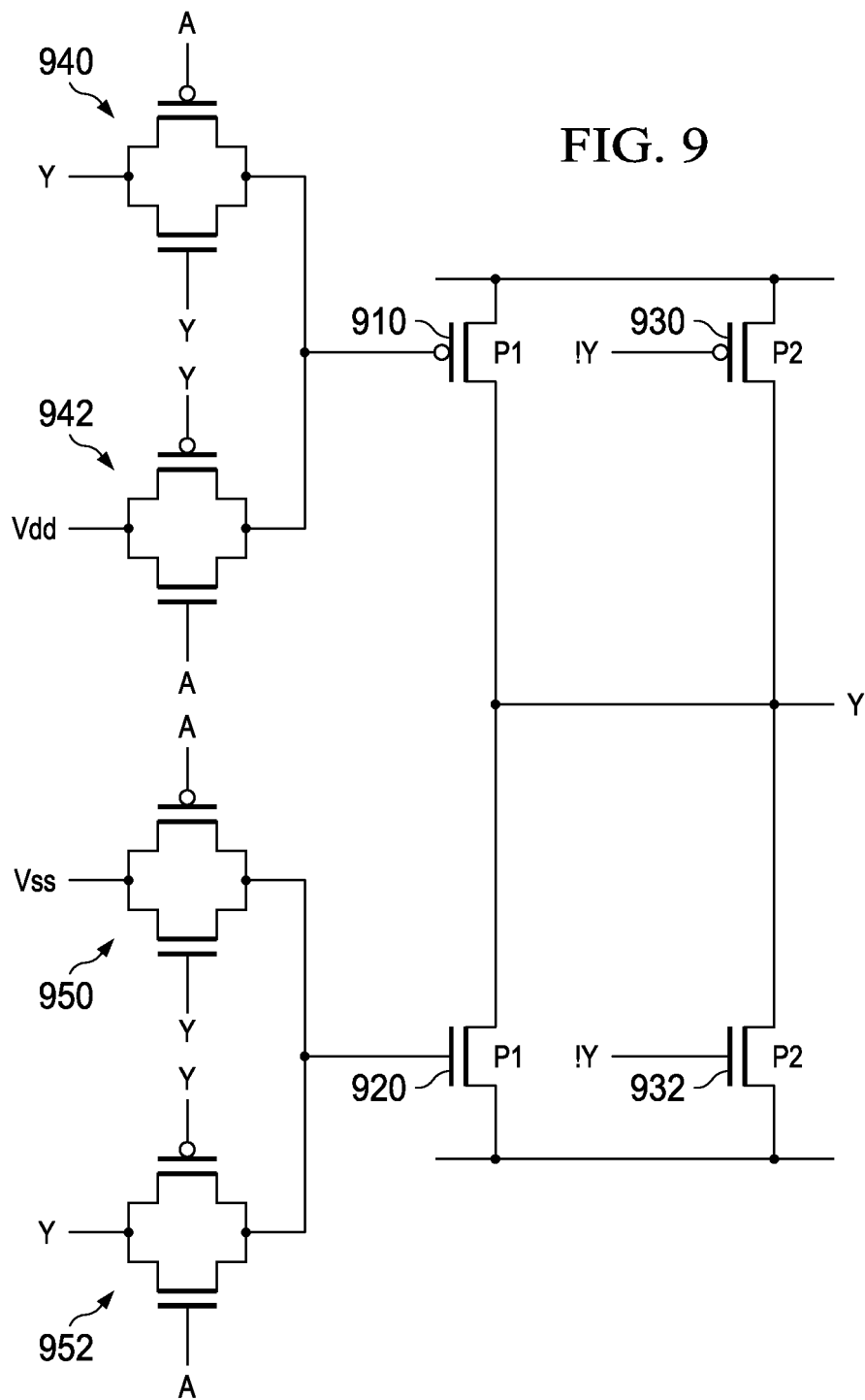

BIAS TEMPERATURE INSTABILITY-RESISTANT CIRCUITS

CLAIM OF PRIORITY

This application for Patent claims priority to U.S. Provisional Application No. 61/502,141 entitled "NOVEL BTI RESILIENT CIRCUITS AND LIBRARY-DESIGN-TECHNIQUES" filed 28 Jun. 2011, wherein the application listed above is incorporated by reference herein.

BACKGROUND

Bias Temperature Instability—(BTI-) induced degradations is a cause of semiconductor product aging. While negative BTI (NBTI) induced degradations predominantly affect PMOS (P-type metal-oxide-semiconductor) transistors, positive BTI (PBTI) induced degradations predominantly affect NMOS (n-type metal-oxide-semiconductor) transistors. The degree of BTI-induced degradation varies in accordance with the amount of the stress voltage, temperature and duration of waveform transitions, the age of the transistors, and characteristics of the transistors being stressed such as the threshold voltage (Vt) and drive current (Idsat), which both degrade over time.

Thus, circuit designers analyze the performance of their circuit/critical paths using End-of-Life (EoL) considerations. However, the analysis of the EoL considerations is non-trivial because the extent and the (e.g., system) impact of aging greatly depends on the history of operations, including voltage levels used, bit patterns, slew rates, duty cycles, and the temperatures in which the circuits are used. Often, the circuits that are most greatly impacted by BTI-induced degradations are power-managed clocks, which are often placed into a power-down mode based in accordance with the state of the gating logic.

SUMMARY

The problems noted above are solved in large part by identifying the critical transistors (e.g., transistors that are likely to be impacted by the BTI-induced degradations) during operation of a circuit. As disclosed herein (for example), functionally equivalent circuits (such as circuits included in standard cells in a design library) are provided to ensure that critical transistors are protected (e.g., by either extending recovery times and/or turning the transistor off in response to a critical edge transition). When the library cells are designed to be tolerant to aging effects such as NBTI as well as PBTI, the potential impact for BTI-induced degradation is greatly reduced, which alleviates the requirement for stringent aging analyses such as EOL closures, voltage tolerance margins, and the like.

BRIEF DESCRIPTION OF THE DRAWINGS

FIG. 8a, FIG. 8b, FIG. 8c, and FIG. 8d are schematic diagrams that illustrate responses to an input signal by an output hold transistor-assisted NBTI-resistant inverter in accordance with embodiments of the disclosure; and FIG. 9 is a schematic diagram illustrating a dual-type output hold transistor-assisted BTI-resistant inverter 900 in accordance with embodiments of the disclosure.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
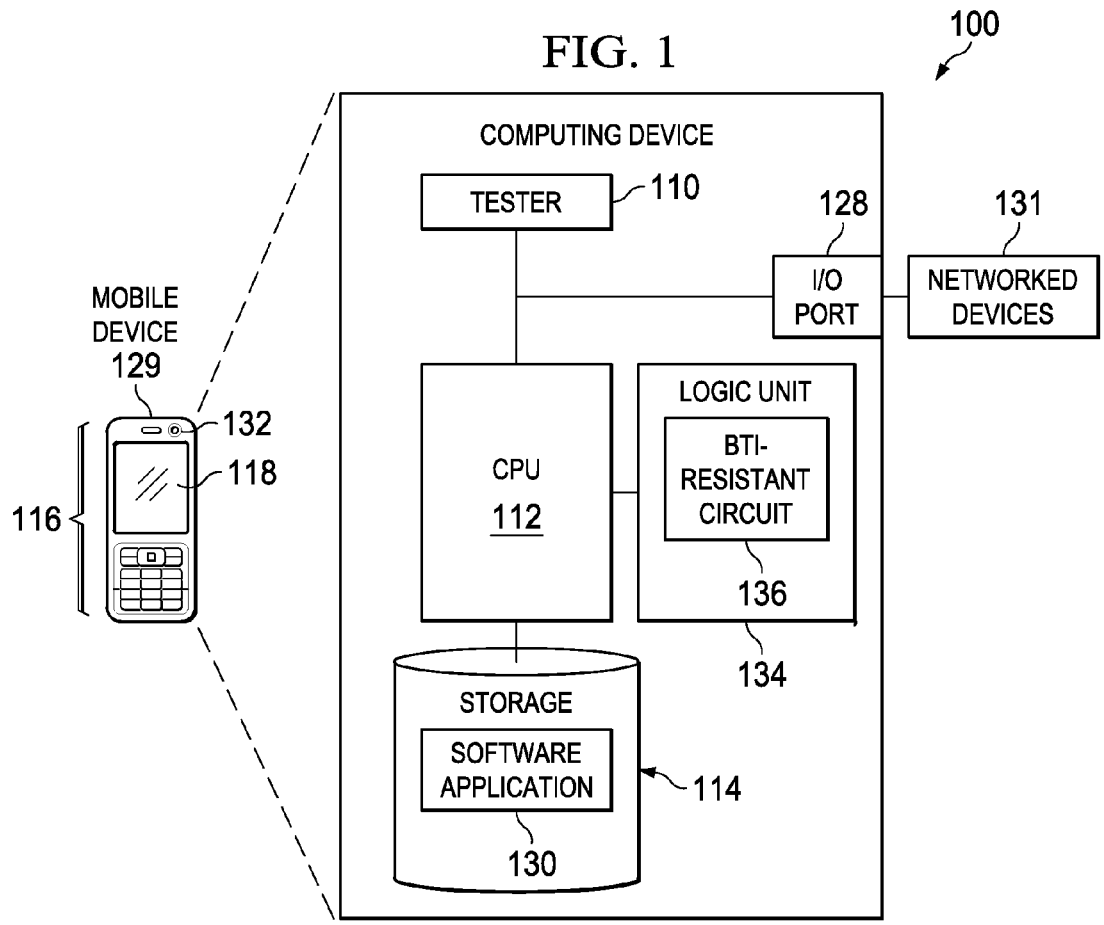
FIG. 1 shows an illustrative computing device in accordance with embodiments of the disclosure.

FIG. 1 shows an illustrative computing device 100 in accordance with embodiments of the disclosure. For example, the computing device 100 is, or is incorporated into, a mobile communication device 129, such as a mobile phone, a personal digital assistant (e.g., a BLACKBERRY® device), a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The CPU 112 can include (or be coupled to) logic unit 134, which includes synchronous (or asynchronous) logic arranged in a common (or separate) substrate. Logic unit 134 includes a BTI-resistant circuit 136 that provides protection for critical transistors against BTI-induced degradations as disclosed herein below.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

In view of the teachings disclosed herein, the effects of BTI-induced degradations and system designs are substantially alleviated by identifying the critical transistors (e.g., transistors that are likely to be impacted by the BTI-induced degradations) during operation of a circuit and using BTI-resistant circuits (such a service provided by cells in a design library) that are provided for use in the target system as functional replacements to ensure that critical transistors are protected.

The critical transistors are protected by enforcing extended recovery times of the critical transistors and/or ensuring that the length of the critical period of transistors is minimized, for example, substantially limiting the critical period to transition times (and by, for example, performing secondary operations using a second set of transistors to maintain the state of a logic output). Thus, by identifying the critical transistors and using BTI-resistant standard cells to emulate the performance of the critical transistors in a system design, the system designer (and the clock tree) produces a robust product in which the effects of aging are substantially reduced. The substantial reduction in the effects of aging alleviates the requirement for stringent aging analyses (such as EOL closures, voltage tolerance margin maintenance, and the like) as well as extending the operational life and confidence in the correct functioning of the system incorporating the BTI-resistant circuits and standard cells.

Figure 2:
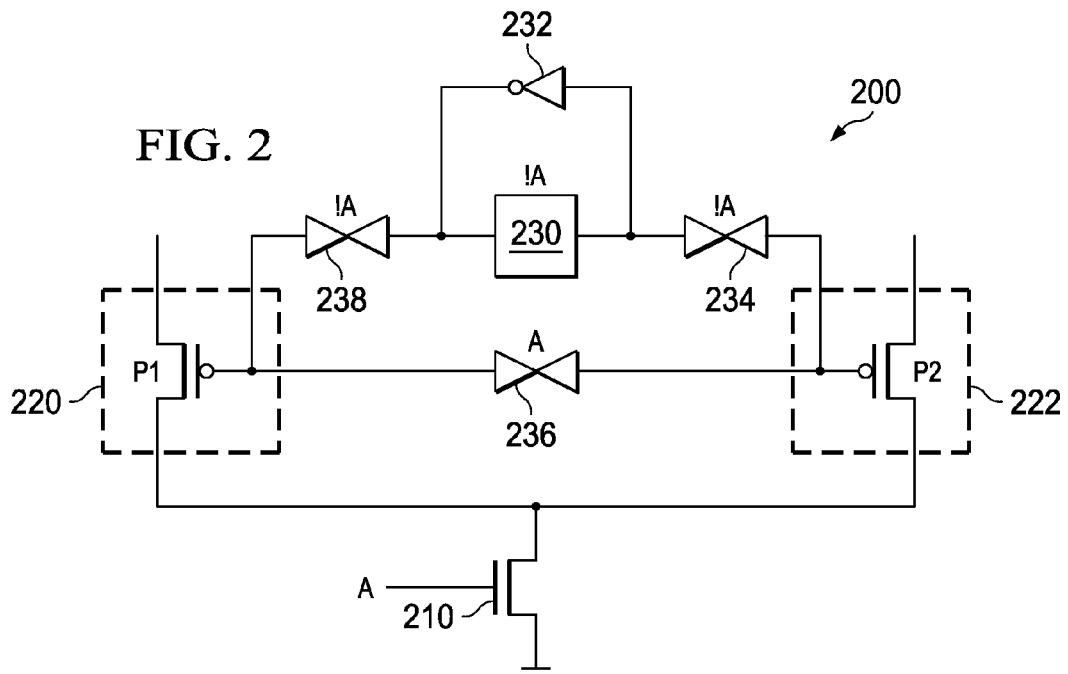
FIG. 2 is a schematic diagram illustrating NBTI-resistant inverter 200 in accordance with embodiments of the disclosure.

FIG. 2 is a schematic diagram illustrating NBTI-resistant inverter 200 in accordance with embodiments of the disclosure. NBTI-resistant inverter 200 is a library cell that can be substituted for a standard library cell, so that the circuit into which the NBTI-resistant inverter 200 is placed has improved BTI characteristics (without, for example, further need for EoL analyses). NBTI-resistant inverter 200 includes an NMOS transistor 210, PMOS transistors 220 and 222, flip flop 230, inverter 232, and transmission gates 234, 236, and 238.

NMOS transistor 210 has a control gate coupled to signal A, a drain that is coupled to ground, and a source that is coupled to the drains of PMOS transistors 220 and 222. The sources of the PMOS transistors 220 and 222 are coupled to the voltage supply rail. The gates of PMOS transistors 220 and 222 are selectively coupled to each other via transmission gate 236, which is selectively activated in accordance with signal A.

The gates of PMOS transistors 220 and 222 are selectively driven in response to the logic state of flip flop 230. Selector 230 is a (for example flip-flop) clocked by signal A-bar ("!A," which is a logical inversion of signal A). The output of selector 230 is coupled to the input of selector 230 via inverter 232. Thus flip flop 230 is arranged to toggle states in response to signal A-bar. The logic state of the input of flip flop 230 is selectively coupled to drive the gate of PMOS transistor 220 when transmission gate 238 is activated by signal A-bar. Similarly, the logic state of the output of selector 230 is selectively to drive the gate of PMOS transistor 222 when transmission gate 234 is activated by signal A-bar.

As discussed below with reference to FIG. 3, the active state of the outputs of PMOS transistor 220 and PMOS transistor 222 are alternated, which reduces the duty cycle of the critical state from 50 percent for a single transistor 25 percent each for PMOS transistors 220 and 222. Reducing the duty cycle of the critical state to 25 percent also increases the recovery time available for each transistor by 200 percent.

Figure 3:
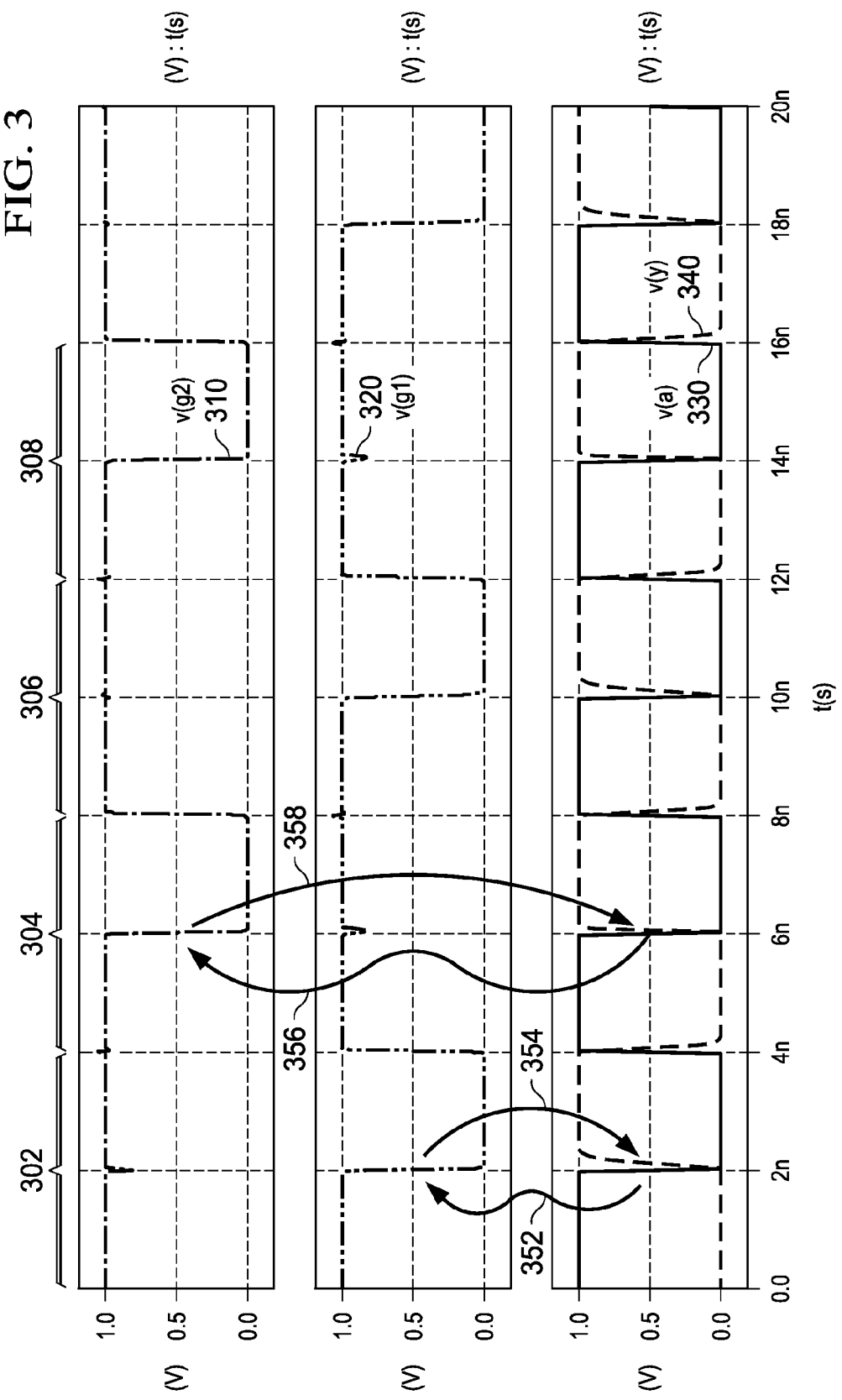
FIG. 3 is a timing diagram illustrating waveforms of an NBTI-resistant inverter in accordance with embodiments of the disclosure.

FIG. 3 is a timing diagram illustrating waveforms of an NBTI-resistant inverter in accordance with embodiments of the disclosure. Waveforms 310, 320, 330, and 340 include a cycle 302, a cycle 304, a cycle 306, and a cycle 308, wherein each cycle has a first portion and a second portion. Waveform 330 illustrates the voltage of the input signal A ("v(a)"), wherein the input signal A toggles state between the first and second portion of each cycle (as well as between cycles).

When input signal A is high (such as during the first portion of cycle 302 as well as each cycle thereafter), transmission gate 236 is on (coupling the gates of PMOS transistors 220 and 222 together) and transmission gates 234 and 238 are off (which isolates the gates of PMOS transistors 220 and 222 from the logic state of the selector 230.

When input signal A transitions low (such as between the first portion and second portions of cycle 302 as well as each cycle thereafter), selector 230 toggles to a low (e.g., zero) state. Transmission gates 234 and 238 are switched on (and transmission gate 236 is switched off) such that the output of selector 230 is coupled to the gate of PMOS transistor 222 and the inverse (via inverter 232) of the output of selector 230 is coupled to the gate of PMOS transistor 220.

Waveform 320 illustrates the voltage of the gate of PMOS transistor 222 ("v(g1)"). Transition 352 of waveform 330 causes selector 230 to toggle to a low state, and being coupled to the gate of PMOS transistor 222; forces waveform 330 low, which thus turns on PMOS transistor 222. When PMOS transistor 222 turns on at transition 354, the output of the NBTI-resistant inverter 200 (e.g., the node of the drains of PMOS transistors 220 and 222) transitions to a high state (as illustrated by waveform 340 "v(y)").

Also during the second portion of cycle 302, the gate of PMOS transistor 220 is in a high state (as illustrated by waveform 310 "v(g2)"). When signal A transitions high between cycle 302 and 304, transmission gates 234 and 238 are switched off and transmission gate 236 is switched on (coupling the charge stored at the gate of PMOS transistor 220 to the gate of PMOS transistor 222, which turns off the PMOS transistor 222).

Waveform 310 illustrates the voltage of the gate of PMOS transistor 220 ("v(g2)"). In cycle 204, transition 356 of waveform 330 causes selector 230 to toggle to a high state, which is then coupled to the gate of PMOS transistor 220 via inverter 232 to force waveform 330 low, which then turns on PMOS transistor 220. When PMOS transistor 220 turns on at transition 358, the output of the NBTI-resistant inverter 200 (e.g., the node of the drains of PMOS transistors 220 and 222) transitions to a high state (as illustrated by waveform 340 "v(y)").

Also during the second portion of cycle 304, the gate of PMOS transistor 222 is in a high state (as illustrated by waveform 320 "v(g1)"). When signal A transitions to a high state between cycle 304 and 306, transmission gates 234 and 238 are switched off and transmission gate 236 is switched on (coupling the charge stored at the gate of PMOS transistor 222 to the gate of PMOS transistor 220), which turns off the PMOS transistor 220.

Thus the output of the NBTI-resistant inverter 200 has a duty cycle of 50 percent during each cycle, whereas the duty cycle for PMOS transistor 220 is 25 percent over a period of two cycles 302 and 304 (as well as the period of cycles 306 and 308), and the duty cycle for PMOS transistor 222 is also 25 percent over a period of two cycles 302 and 304 (as well as the period of cycles 306 and 308). Accordingly, the active period of PMOS transistor 222 is interposed in time between the active periods of PMOS transistor 220. Thus the recovery time is extended and the "on" time during the critical period is shortened.

Figure 4:
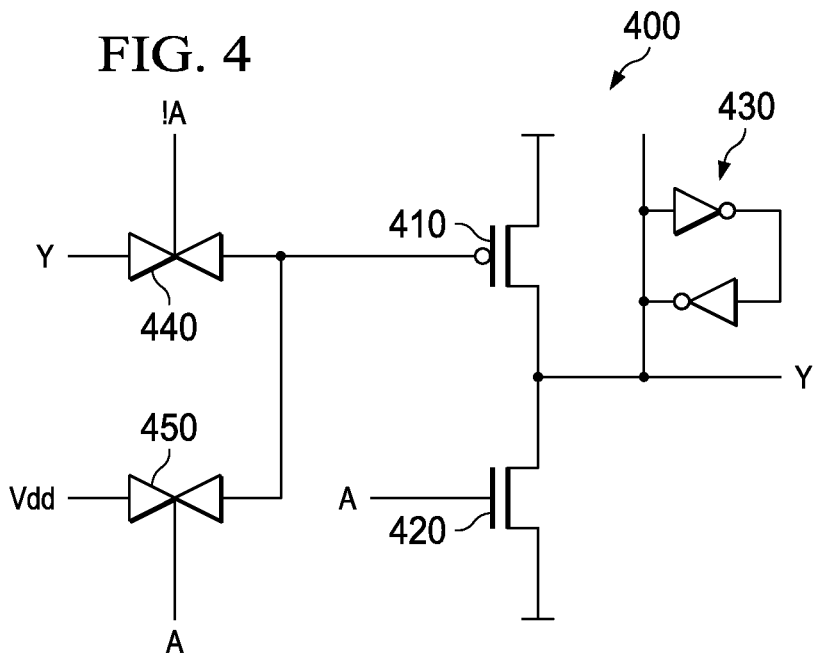
FIG. 4 is a schematic diagram illustrating output latch-assisted NBTI-resistant inverter 400 in accordance with embodiments of the disclosure.

FIG. 4 is a schematic diagram illustrating output latch-assisted NBTI-resistant inverter 400 in accordance with embodiments of the disclosure. Output latch-assisted NBTI-resistant inverter 400 is a library cell that can be used to replace an instance of a standard library cell in a design, so that the circuit into which the output latch-assisted NBTI-resistant inverter 400 is placed has improved BTI characteristics (and without, for example, further need for EoL analysis). Output latch-assisted NBTI-resistant inverter 400 includes a PMOS transistor 410, an NMOS transistor 420, an output latch 430, and transmission gates 440 and 450.

PMOS transistor 410 and NMOS transistor 420 are arranged as an inverter having an output signal Y. Output signal Y is coupled to latch 430, which is a weakly self-driven (e.g., having a self-contained feedback loop formed by respectively coupling the output to the input of each inverter) latch that is a hold circuit having a state that is overridden by the stronger output of the inverter formed by PMOS transistor 410 and NMOS transistor 420. The state of the inverter formed by PMOS transistor 410 and NMOS transistor 420 is held by latch 430 when PMOS transistor 410 and NMOS transistor 420 are tristated, for example.

Transmission gate 440 is arranged to selectively couple the output signal Y to the gate of PMOS transistor 410 in response to signal A-bar (!A). Likewise, transmission gate 450 is arranged to selectively couple Vdd (e.g., by using the supply voltage rail to represent a high logic state) to the gate of PMOS transistor 410 in response to signal A.

Accordingly, when signal A is high, NMOS transistor 420 conducts, which forces output signal Y to a low logic state and overrides the logic state latched by latch 430. Also when signal A is high, transmission gate 450 conducts, which couples Vdd to the gate of PMOS transistor 410 and turns off (and/or maintains in an off state) PMOS transistor 410. When signal A transitions to a low state, NMOS transistor 420 stops conducting so that transmission gate 450 stops conducting, transmission gate 440 is activated, and signal Y is coupled to the gate of PMOS transistor 410.

Because signal Y is in a low logic state, PMOS transistor 410 conducts, which causes signal Y to transition to a high logic state and overrides the voltage (relatively weakly) latched by latch 430. When signal Y transitions to a high logic state (and being coupled to the gate of PMOS transistor 410), PMOS transistor 410 is turned off, which places the output of the inverter formed by PMOS transistor 410 and NMOS transistor 420 into a tristated condition. However, latch 430 maintains the logic state of signal Y, which is currently in the high logic state. Thus the output of output latch-assisted NBTI-resistant inverter 400 is maintained in the high logic state without requiring PMOS transistor 410 to remain turned on in a critical state (thus alleviating conditions that lead to BTI-related failures).

Figure 5:
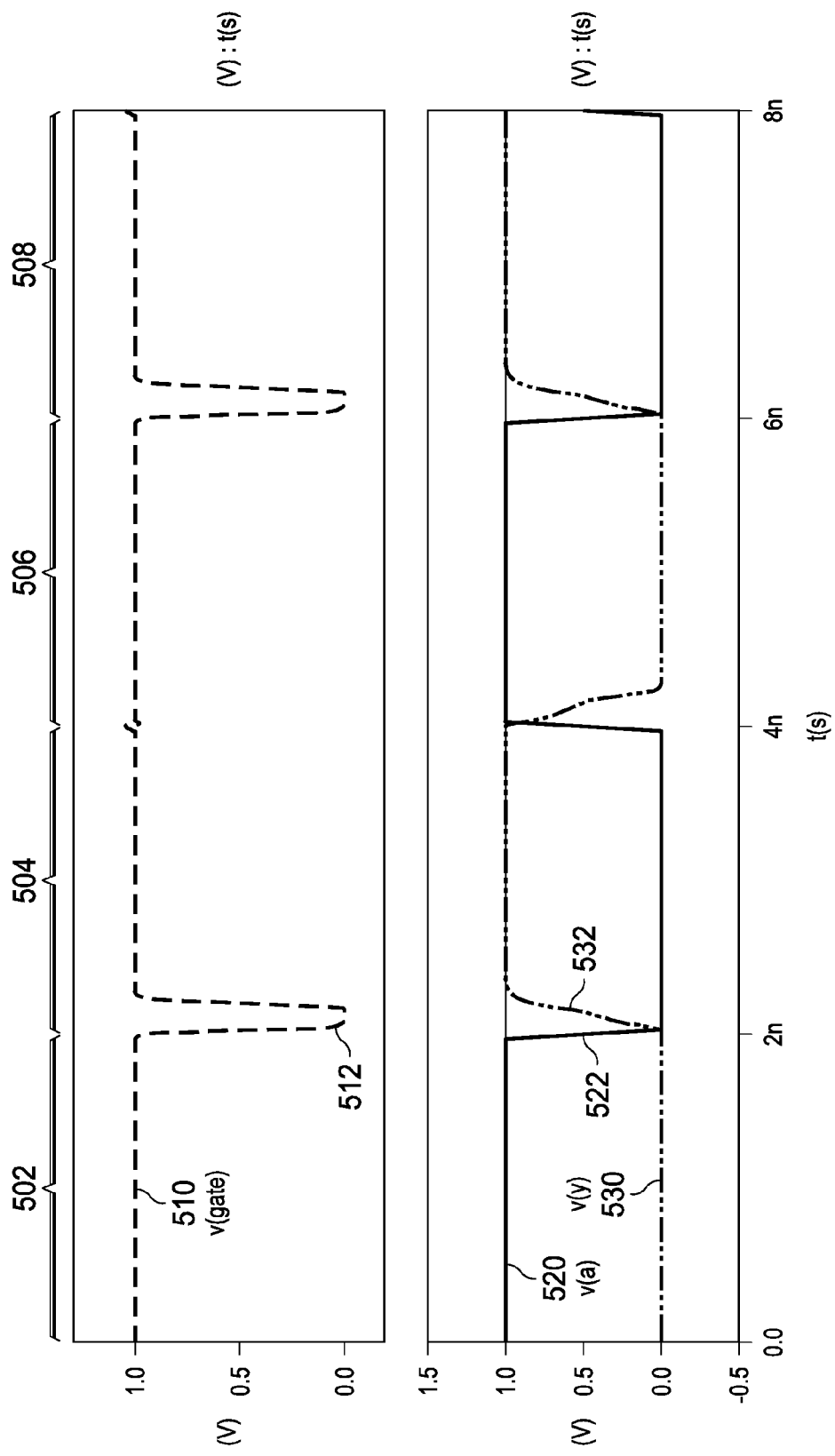
FIG. 5 is a timing diagram illustrating waveforms of an output latch-assisted NBTI-resistant inverter in accordance with embodiments of the disclosure.

FIG. 5 is a timing diagram illustrating waveforms of an output latch-assisted NBTI-resistant inverter in accordance with embodiments of the disclosure. Waveforms 510, 520, and 530 include cycles 502, 504, 506, and 508. Waveform 520 illustrates the voltage of the input signal A ("v(a)"), wherein the input signal A toggles state between each cycle.

When input signal A is high (such as during cycle 502 and 506), NMOS transistor 420 remains in an on state (which holds output signal Y in a low state), transmission gate 450 is on (coupling the gate of PMOS transistor 410 to Vdd) and transmission gate 440 is off (which isolates the gate of PMOS transistor 410 from the logic state of output signal Y).

When input signal A transitions low (such as at transition 522), transmission gate 450 is turn off and transmission gate 440 is turned on (which couples the logic state of signal Y to the gate of PMOS transistor 410). Accordingly, PMOS transistor 410 is turned on (at least momentarily) causing transition 510. When PMOS transistor 410 is turned on, output signal Y is driven to a logic high state at transition 532, which in turn is coupled via transmission gate 440 to the gate of PMOS transistor 410. When output signal Y transitions to a high logic state at the gate of PMOS transistor 410, PMOS transistor 410 stops conducting and is thus tristated. The logic state of the output signal Y remains at a high state because of the (weakly driven) output latch 430.

The state of output signal Y output is reset to a low state in response to input signal A transitioning to a high state between cycle 504 and cycle 506. When input signal A transitions to a high state, NMOS transistor 420 is turned on (which resets output signal Y to the low state), transmission gate 450 is turned on (coupling the gate of PMOS transistor 410 to Vdd) and transmission gates 440 is turned off (which isolates the gate of PMOS transistor 410 from the logic state of output signal Y). Because PMOS transistor 410 is normally only on as the output signal Y transitions from a low state to a high state, aging considerations that are related to remaining on in a critical state are greatly reduced.

Figure 6:
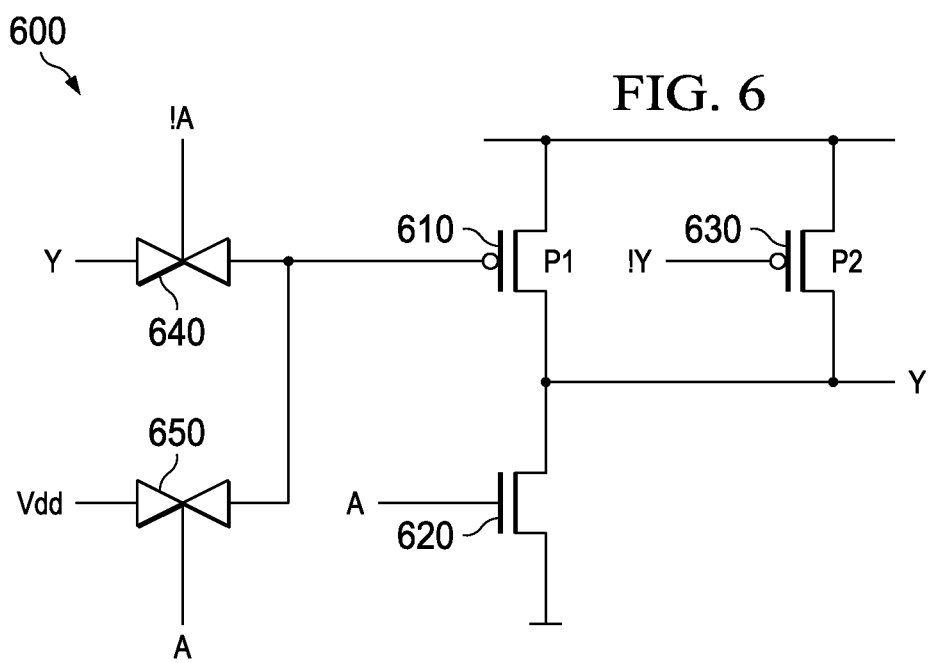
FIG. 6 is a schematic diagram illustrating output hold transistor-assisted NBTI-resistant inverter 600 in accordance with embodiments of the disclosure.

FIG. 6 is a schematic diagram illustrating output hold transistor-assisted NBTI-resistant inverter 600 in accordance with embodiments of the disclosure. Output hold transistor-assisted NBTI-resistant inverter 600 is a library cell that can be used to replace an instance of a standard library cell in a design, so that the circuit into which the output hold transistor-assisted NBTI-resistant inverter 600 is placed has improved BTI characteristics (and without, for example, further need for EoL analysis). Output hold transistor-assisted NBTI-resistant inverter 600 includes a PMOS transistor 610, an NMOS transistor 620, an output hold transistor 630, and transmission gates 640 and 650.

PMOS transistor 610 and NMOS transistor 620 are arranged as an inverter having an output signal Y. Output signal Y is coupled to hold transistor 630, which is a PMOS transistor that is arranged to latch (via a feedback path in the circuit, such provided in part by output signal Y) the output of output hold transistor-assisted NBTI-resistant inverter 600 when output signal Y is in a high state. The state of the inverter formed by PMOS transistor 610 and NMOS transistor 620 is held by output hold transistor 630 when PMOS transistor 610 and NMOS transistor 620 is tristated and output signal Y is in a high logic state (e.g., with signal Y-bar, "!Y," being in a low logic state, for example).

Transmission gate 640 is arranged to selectively couple the output signal Y to the gate of PMOS transistor 610 in response to signal A-bar (!A). Likewise, transmission gate 650 is arranged to selectively couple a high logic state (e.g., Vdd) to the gate of PMOS transistor 610 in response to signal A being in a high logic state.

Accordingly, when signal A is high, NMOS transistor 620 conducts, which forces output signal Y to a low logic state and turns off (and/or maintains in an off state) hold transistor 630. Also when signal A is high, transmission gate 650 conducts, which couples Vdd to the gate of PMOS transistor 610 and turns off (or maintains in an off state) PMOS transistor 610. When signal A transitions to a low state, NMOS transistor 620 stops conducting, transmission gate 650 stops conducting, transmission gate 640 is activated, and signal Y is coupled to the gate of PMOS transistor 610.

Because signal Y is in a low logic state, PMOS transistor 610 conducts, which causes signal Y to transition to a high logic state and turns on output hold transistor 630 (with signal Y-bar being in a low logic state). When signal Y transitions to a high logic state (and being coupled to the gate of PMOS transistor 610), PMOS transistor 610 is turned off, which places the output of the inverter formed by PMOS transistor 610 and NMOS transistor 620 into a tristated condition. However, output hold transistor 630 (being turned on) maintains the logic state of signal Y, which is currently in the high logic state. Thus the output of output hold transistor-assisted NBTI-resistant inverter 600 is maintained in a high logic state without requiring PMOS transistor 610 to remain being turned on in a critical state (thus alleviating conditions that lead to BTI-related failures).

Figure 7:
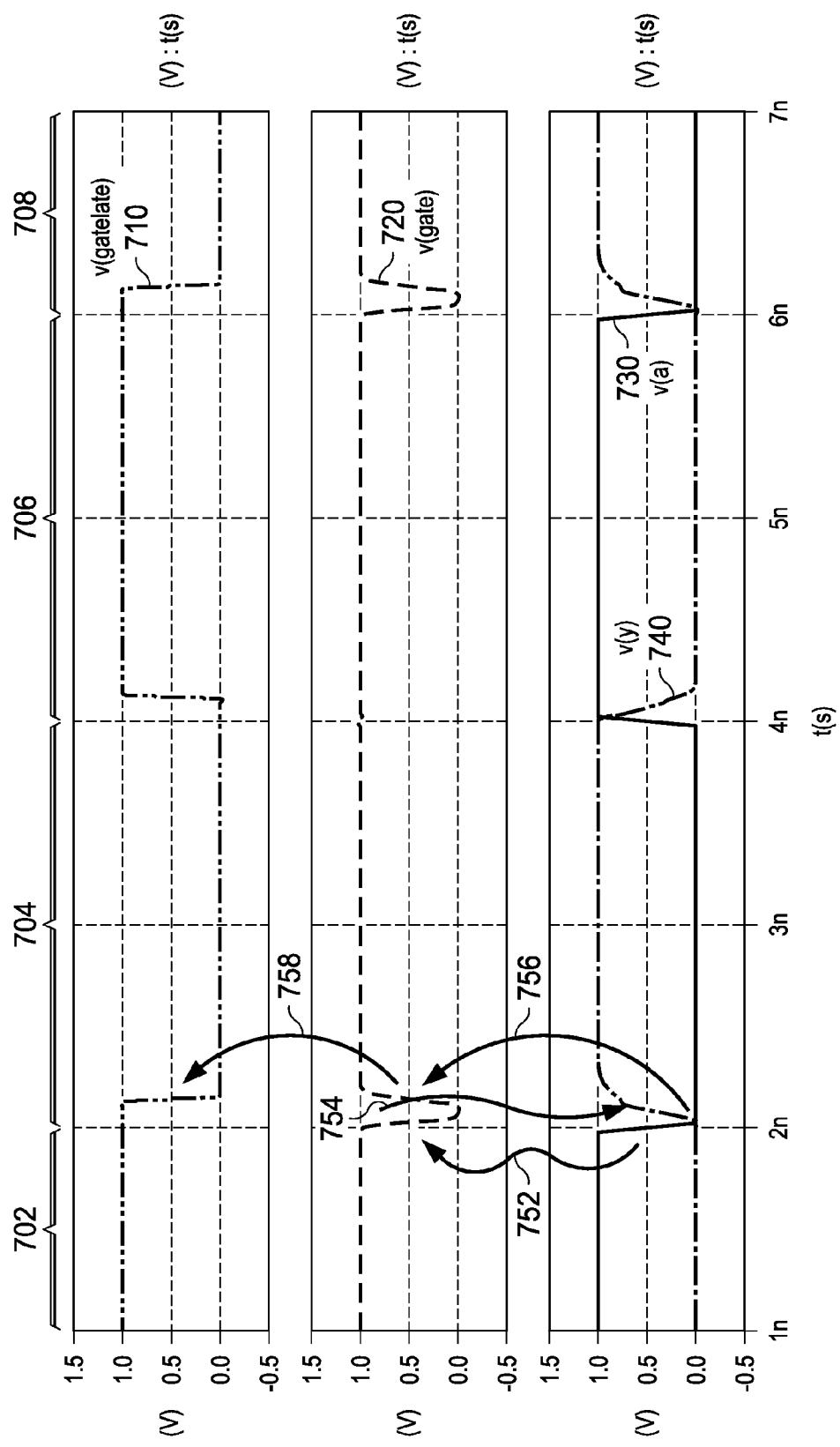
FIG. 7 is a timing diagram illustrating waveforms of an output hold transistor-assisted NBTI-resistant inverter in accordance with embodiments of the disclosure.

FIG. 7 is a timing diagram illustrating waveforms of an output hold transistor-assisted NBTI-resistant inverter in accordance with embodiments of the disclosure. Waveforms 710, 720, 730, and 740 include cycles 702, 704, 706, and 708. Waveform 730 illustrates the voltage of the input signal A ("v(a)"), wherein the input signal A toggles state between each cycle.

When input signal A is high (such as during cycle 702 and 706), NMOS transistor 620 remains turned on (which holds output signal Y in a low state), transmission gate 650 is turned on (coupling the gate of PMOS transistor 610 to Vdd) and transmission gate 640 is off (which isolates the gate of PMOS transistor 610 from the logic state of output signal Y).

When input signal A transitions low, transmission gate 650 is turned off and transmission gate 640 is turned on (which couples the logic state of signal Y to the gate of PMOS transistor 610) at transition 752. Accordingly, PMOS transistor 610 is turned on (at least momentarily) causing transition 754. When PMOS transistor 610 is turned on, output signal Y is driven to a logic high state, which in turn is asserted via transmission gate 640 to the gate of PMOS transistor 610 at transition 756.

Waveform 710 illustrates the voltage of a slightly delayed signal Y-bar ("v(gatelate)"), which is coupled to the gate of output hold (PMOS) transistor 630. At transition 758, signal Y-bar transitions low in response to the rising edge of signal Y at transition 754. When output signal Y transitions to a high logic state at the gate of PMOS transistor 610, PMOS transistor 610 stops conducting and is thus tristated. However, the logic state of the output signal Y remains at a high state because of the current supplied by output hold transistor 630.

The state of output signal Y output is reset to a low state in response to input signal A transitioning to a high state between cycle 704 and cycle 706. When input signal A transitions to a high state, NMOS transistor 620 is turned on (which resets output signal Y to the low state), transmission gate 650 is turned on (coupling the gate of PMOS transistor 610 to Vdd) and transmission gate 640 is turned off (which isolates the gate of PMOS transistor 610 from the logic state of output signal Y).

FIG. 8a, FIG. 8b, FIG. 8c, and FIG. 8d are schematic diagrams that illustrate responses to an input signal by an output hold transistor-assisted NBTI-resistant inverter in accordance with embodiments of the disclosure. Output hold transistor-assisted NBTI-resistant inverter 800 includes a PMOS transistor 810, an NMOS transistor 820, an output hold transistor 830, and transmission gates 840 and 850. The components of output hold transistor-assisted NBTI-resistant inverter 800 are arranged in similar fashion to the components of output hold transistor-assisted NBTI-resistant inverter 600.

Figure 8A:
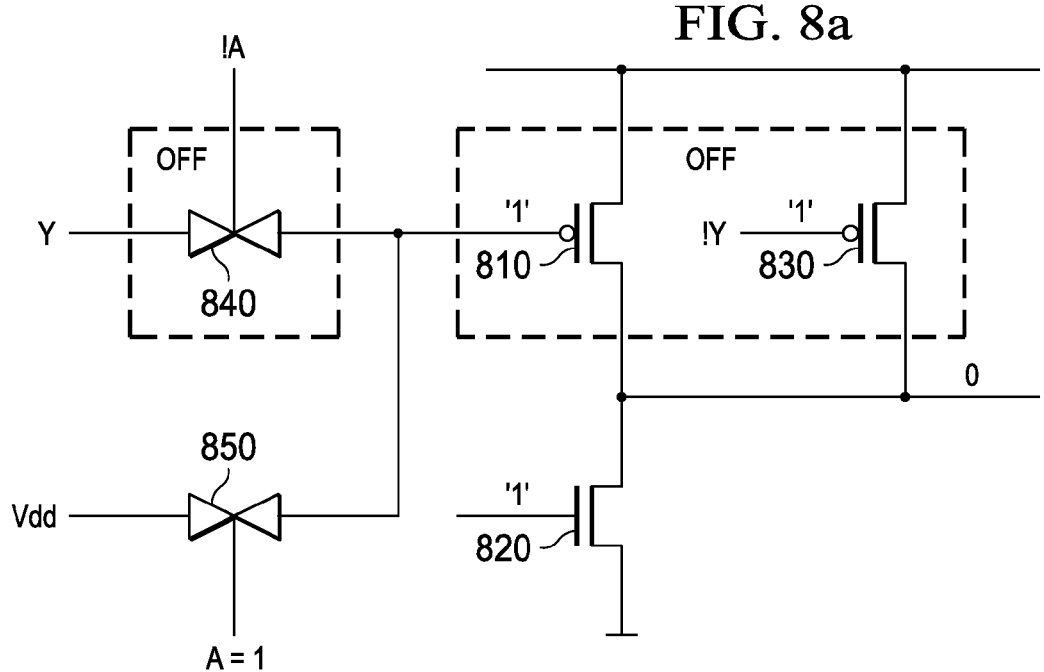

With reference to FIG. 8a, the response to output hold transistor-assisted NBTI-resistant inverter 800 to the steady state input of input signal being maintained at a logic high state (A=1). When input signal A is maintained at a logic high state, transmission gate 840 is off while transmission gate 850 is on such that a high state is applied to the gate of PMOS transistor 810 so that PMOS transistor 810 is in an off state. Likewise, output hold transistor 830 is off such that the output value of the output hold transistor-assisted NBTI-resistant inverter 800 is not affected by the output hold transistor 830. However, when input signal A is maintained at a logic high state, NMOS transistor 820 conducts such that the output value of the output hold transistor-assisted NBTI-resistant inverter 800 is in low logic state (e.g., zero).

With reference to FIG. 8a, the response to output hold transistor-assisted NBTI-resistant inverter 800 to the steady state input of input signal being maintained at a logic high state (A=1) is illustrated. When input signal A is maintained at a logic high state, transmission gate 840 is off while transmission gate 850 is on such that a high state is applied to the gate of PMOS transistor 810 so that PMOS transistor 810 is in an off state. Likewise, output hold transistor 830 is (turned) off such that the output value of the output hold transistor-assisted NBTI-resistant inverter 800 is not affected by the output hold transistor 830. However, when input signal A maintained at a logic high state, NMOS transistor 820 conducts such that the output value of the output hold transistor-assisted NBTI-resistant inverter 800 is in low logic state (e.g., zero).

Figure 8B:
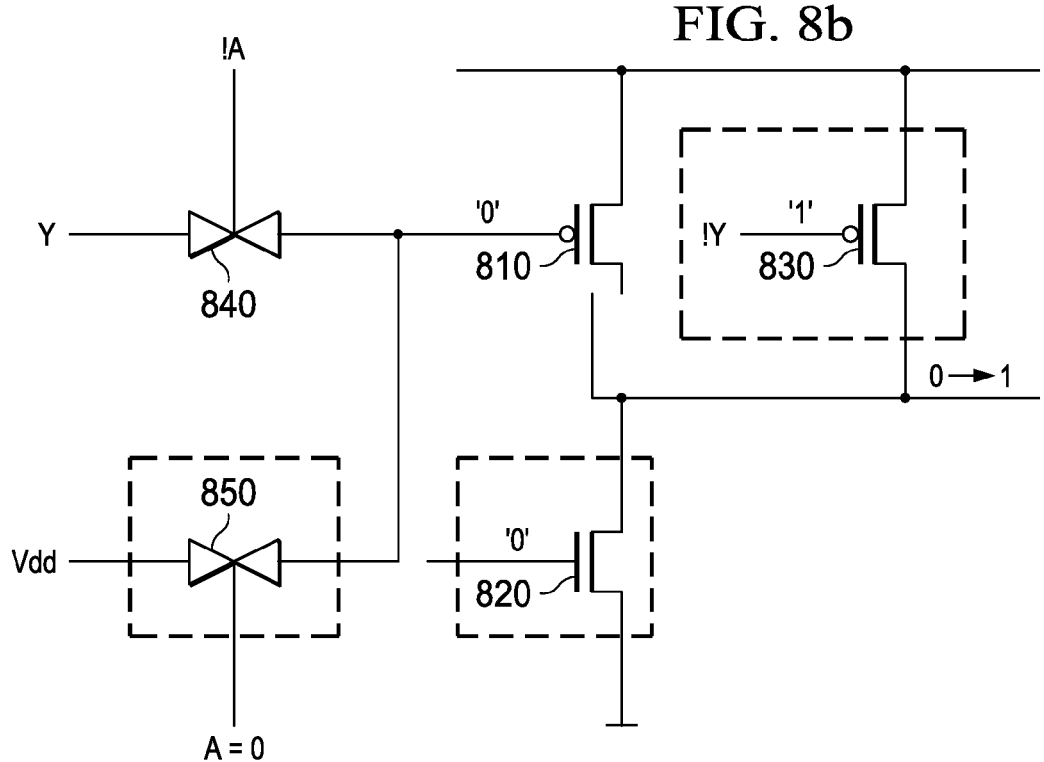

With reference to FIG. 8b, the response to output hold transistor-assisted NBTI-resistant inverter 800 to the input of input signal transitioning from a high state (A=1) to a low state (A=0) is illustrated. When input signal A transitions to a low state, transmission gate 850 turns off while transmission gate 840 is on such that the output signal (which is still at a low state) is applied to the gate of PMOS transistor 810 so that PMOS transistor 810 is transitioned to an on state. When input signal A transitions to a low state, NMOS transistor 820 is turned off such that the output value of the output hold transistor-assisted NBTI-resistant inverter 800 transitions to a high state (because PMOS transistor 810 is now on). Output hold transistor 830 is still in an off state such that the output value of the output hold transistor-assisted NBTI-resistant inverter 800 is not affected by the output hold transistor 830.

With reference to FIG. 8c, the response to output hold transistor-assisted NBTI-resistant inverter 800 to the steady state input of input signal being maintained at a low state (A=0) is illustrated. When input signal A remains in a low state, transmission gate 850 remains off while transmission gate 840 remains on such that the output signal (which transitions from a low state to a high state as described above with reference to FIG. 8b) is applied to the gate of PMOS transistor 810 so that PMOS transistor 810 is transitioned to an off state. When input signal A remains in a low state, NMOS transistor 820 remains off such that the output value of the output hold transistor-assisted NBTI-resistant inverter 800 is tristated (because PMOS transistor 810 is now turned off). However, output hold transistor 830 is transitioned to an on state such that the previous output value of the output hold transistor-assisted NBTI-resistant inverter 800 (high logic state) is effectively latched by the output hold transistor 830 which uses the feedback signal coupled to the gate of output hold transistor 830 to maintain the high logic state at the drain of the output hold transistor 830.

With reference to FIG. 8d, the response to output hold transistor-assisted NBTI-resistant inverter 800 to the input of input signal transitioning from a low state (A=0) to a logic high state (A=1) is illustrated. When input signal A is transitioned to a high state, transmission gate 840 turns off while transmission gate 850 turns on such that a high state is applied to the gate of PMOS transistor 810 so that PMOS transistor 810 is in an off state. Likewise, output hold transistor 830 is still on (to be reset as in FIG. 8a in response to the propagation of the transition of the output of the output hold transistor-assisted NBTI-resistant inverter 800 to a low state) such that the output value of the output hold transistor-assisted NBTI-resistant inverter 800 is not affected by the output hold transistor 830. However, when input signal A is transitioned to a logic high state, NMOS transistor 820 conducts such that the output value of the output hold transistor-assisted NBTI-resistant inverter 800 transitions to a low logic state (e.g., zero).

FIG. 9 is a schematic diagram illustrating a complementary-type output hold transistor-assisted BTI-resistant inverter 900 in accordance with embodiments of the disclosure. Complementary-type output hold transistor-assisted BTI-resistant inverter 900 is a library cell that can be used to replace an instance of a standard library cell in a design. Accordingly, the circuit into which the complementary-type output hold transistor-assisted BTI-resistant inverter 900 is placed has improved BTI characteristics (and without, for example, further need for EoL analysis). For example, when design parameters implicate either (or both) of an inverter's complementary transistors as being a "critical" transistor for the purpose of circuit aging (also, for example), the identified transistor is (e.g., automatically) replaced by the design tool.

The complementary-type output hold transistor-assisted BTI-resistant inverter 900 the complementary-type output hold transistor-assisted BTI-resistant inverter 900 includes a PMOS transistor 910, an NMOS transistor 920, output hold transistors 930 and 932, and transmission gates 940, 942, 950, and 952. Complementary-type output hold transistor-assisted BTI-resistant inverter 900 is both NBTI-resistant and PBTI-resistant.

PMOS transistor 910 and NMOS transistor 920 are arranged as an inverter having an output signal Y. Output signal Y is coupled to hold transistor 930, which is a PMOS transistor, and to hold transistor 932, which is an NMOS transistor. Hold transistor 930 is arranged hold (in a high state) the output of output hold transistor-assisted BTI-resistant inverter 900 when output signal Y is in a high state. Hold transistor 940 is arranged to hold (in a low state) the output of output hold transistor-assisted BTI-resistant inverter 900 when output signal Y is in a low state. The state of the inverter formed by PMOS transistor 910 and NMOS transistor 920 is thus held by output hold transistor 930 or output hold transistor 432 when PMOS transistor 910 and NMOS transistor 920 are tristated.

In an initial state (such as similarly illustrated above with respect to FIG. 8a), when input signal A is maintained at a logic high state and output signal Y is at a low state, transmission gate 940 is off while transmission gate 942 is on such that a high state is applied to the gate of PMOS transistor 910 so that PMOS transistor 910 is in an off state. Likewise, output hold transistor 930 is (turned) off such that the output value of the complementary-type output hold transistor-assisted BTI-resistant inverter 900 is not affected by the output hold transistor 930. Likewise, when input signal A is maintained at a logic high state and output signal Y is at a low state, transmission gate 950 is off while transmission gate 952 is on such that a low state (the current state of output signal Y) is applied to the gate of NMOS transistor 920 so that NMOS transistor 920 is also in an off state. However, the output hold transistor 932 is (turned) on (by the current high state of signal Y-bar) such that the output value of the complementary-type output hold transistor-assisted BTI-resistant inverter 900 is maintained at the low logic state (e.g., zero).

In a subsequent state (such as similarly illustrated above with respect to FIG. 8b), the complementary-type output hold transistor-assisted BTI-resistant inverter 900 responds to the input of input signal transitioning from a high state (A=1) to a low state (A=0). When input signal A transitions to a low state (and output signal Y presently remains in a low state), transmission gate 942 is in a weaker on state while transmission gate 940 is in a stronger on state such that the output signal Y (which is still at a low state) is applied to the gate of PMOS transistor 910 so that PMOS transistor 910 is transitioned to an on state. Likewise, when input signal A transitions to a low state (and output signal Y presently remains in a low state), transmission gate 952 is in a weaker on state while transmission gate 950 is in a stronger on state such that the Vss ground (which is a low state) is applied to the gate of NMOS transistor 920 so that NMOS transistor 920 is turned off such that the output value of the complementary-type output hold transistor-assisted BTI-resistant inverter 900 transitions to a high state (because PMOS transistor 910 is now in an on state and having a source coupled to Vdd power). Output hold transistor 930 is still in an off state such that the output value of the complementary-type output hold transistor-assisted BTI-resistant inverter 900 is not affected by the output hold transistor 930. Output hold transistor 932 is still in a weaker on state such that the logical output value (now in a high state) of the complementary-type output hold transistor-assisted BTI-resistant inverter 900 is not changed by the "pull down" current of output hold transistor 930

In a later subsequent state (such as similarly illustrated above with respect to FIG. 8c), the response to complementary-type output hold transistor-assisted BTI-resistant inverter 900 to the steady state input of input signal being maintained at a low state (A=0). When input signal A remains in a low state, transmission gate 942 is turned off (by the transition of output signal Y to a high state) while transmission gate 940 remains on such that the output signal Y (which transitions from a low state to a high state as described above with reference to FIG. 9b) is applied to the gate of PMOS transistor 910 so that PMOS transistor 910 is transitioned to an off state. When input signal A remains in a low state, transmission gate 952 is turned off (by the transition of output signal Y to a high state) while transmission gate 950 remains weakly on such that Vss ground is applied to the gate of NMOS transistor 920 so that NMOS transistor 920 remains off such that the output value of the complementary-type output hold transistor-assisted BTI-resistant inverter 900 is tristated (because PMOS transistor 910 is now also turned off). However, output hold transistor 930 is transitioned to an on state such that the previous output value of the complementary-type output hold transistor-assisted BTI-resistant inverter 900 (high logic state) is effectively latched by the output hold transistor 930 which uses the feedback signal (e.g., the inversion of output signal Y) coupled to the gate of output hold transistor 930 to maintain the high logic state at the drain of the output hold transistor 930.

In an even later subsequent state (such as similarly illustrated above with respect to FIG. 8d), the response to complementary-type output hold transistor-assisted BTI-resistant inverter 900 to the input of input signal transitioning from a low state (A=0) to a logic high state (A=1). When input signal A is transitioned to a high state (and output signal Y is still in a high logic state), transmission gate 940 is in a weaker on state while transmission gate 942 is in a stronger on state such that a high state is applied to the gate of PMOS transistor 910 so that PMOS transistor 910 is in an off state. Likewise, output hold transistor 930 is still on (and output hold transistor 932 is still off) such that the output value of the output hold transistor-assisted BTI-resistant inverter 900 is not affected by the output hold transistor 930 (or output hold transistor 932). However, when input signal A is transitioned to a logic high state (and output signal Y is still in a high logic state), transmission gate 940 is in a weaker on state while transmission gate 952 is in a stronger on state such that a high state (output signal Y) is applied to the gate of NMOS transistor 920 so that NMOS transistor 920 conducts such that the output value of the complementary-type output hold transistor-assisted BTI-resistant inverter 900 transitions to a low logic state (e.g., zero), thus forcing output signal Y to a low state.

Thus the output of complementary-type output hold transistor-assisted BTI-resistant inverter 900 is maintained at both a high logic state (without requiring PMOS transistor 910 to remain being turned on in a critical state) and a low logic state (without requiring PMOS transistor 910 to remain being turned on in a critical state). Output signal Y is arranged as a portion of a feedback loop so that both output states (high and low) are maintained by non-critical transistors and the critical transistors are on for a time that is substantially limited to a positive or negative slope transition and/or switching period. Thus the complementary-type output hold transistor-assisted BTI-resistant inverter 900 can be used in designs to obviate BTI-related concerns with respect to complementary-type output hold transistor-assisted BTI-resistant inverter 900 used in virtually any logic application using complementary type logic devices.

The various embodiments described herein may be implemented using positive and/or negative logic and/or using complementary types (e.g., P-type MOS and N-type MOS) of the transistors shown in the various embodiments. For example, the NBTI-resistant inverter 200 can be implemented using a plurality of NMOS transistors to sequentially apportion on-time periods (as compared to apportioning the on-time periods of the PMOS transistors 220 and 222, for example). Additional PMOS transistors can be used (in conjunction with a counter/decoder arrangement) to sequentially select three or more PMOS transistors coupled in parallel with the PMOS transistors 220 and 222.

Likewise, NMOS transistor 420 can be gated (in comparison with PMOS transistor 410 that is gated by transmission gates 440 and 450) to reduce the on time of NMOS transistor 420. Also, in a similar fashion, NMOS transistor 620 is protectable by selectively gating the NMOS transistor 620 (in similar fashion to the gating of PMOS transistor 610) to reduce the on time of NMOS transistor 620. As demonstrated by the gating of PMOS transistor 910 and NMOS transistor 920, the on-times of both transistors can be (within the period of an input transitioning both to a high state and to a low state) protected at the same time. Thus, critical transistors of both P-type and N-type are protectable either singly (either PMOS-only or NMOS-only) or in combination (both PMOS and NMOS) using the teachings disclosed herein.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A Bias Temperature Instability—(BTI-) resistant circuit, comprising a first group of one or more first type transistors that is arranged to cause a first direction transition wherein the state of an output signal of the BTI-resistant circuit is switched from a first state to a second state;
   a second group of one or more second type transistors that is arranged to cause a second direction transition wherein the state of an output signal of the BTI-resistant circuit is switched from the second state to the first state, wherein the second type is complementary to the first type; and
   a selector that is arranged to cause a first transistor of the first group of one or more first type transistors to transition in a first direction in between each first direction transition caused by a second transistor of the first group of one or more first type transistors, such that active states of the first transistor and the second transistor of the first group are alternated after one or more second direction transitions, which reduces duty cycle of a critical state of the first group of transistors; and wherein the selector is arranged to cause a first transistor of the second group of one or more second type transistors to transition in a second direction in between each second direction transition caused by a second transistor of the second group of one or more second type transistors.

2. The device of claim 1, wherein the one or more first type transistors are PMOS transistors.

3. The device of claim 1, wherein the selector is arranged to cause a third transistor of the first group of one or more first type transistors to transition in the first direction between each first direction transition caused by the second transistor of the first group of one or more first type transistors.

4. The device of claim 1, comprising a latch that is arranged to maintain a state by which the selector determines which transistor of the first group of one or more first type transistors to select to cause a next first direction transition.

5. The device of claim 1, wherein the selector includes a feedback signal that is provided as an output of the selector and used as an input for the selector, by which the selector determines which transistor of the first group of one or more first type transistors to select to cause the next first direction transition.

6. The device of claim 1, wherein the device is an inverter.

7. The device of claim 1, wherein the device is arranged as a BTI-resistant standard cell.

8. A Bias Temperature Instability—(BTI-) resistant circuit, comprising:
   a first transistor of a first type that is arranged to cause a first direction transition wherein the state of an output signal of the BTI-resistant circuit is switched from a first state to a second state;
   a second transistor of a second type that is arranged to cause a second direction transition wherein the state of an output signal of the BTI-resistant circuit is switched from the second state to the first state, wherein the second type is complementary to the first type;
   a selector that is arranged to detect the first direction transition and in response to the detection of the first direction transition to change the logic state of the gate of the first transistor before an occurrence of a next second direction transition; and that is arranged to detect the second direction transition and in response to the detection of the second direction transition to change the logic state of the gate of a third transistor of first type before the occurrence of the next first direction transition such that the next first direction transition is done by the third transistor; and
   a hold circuit that is arranged to hold the output signal in the second state until the occurrence of the next second direction transition.

9. The circuit of claim 8, wherein the hold circuit is a weakly driven latch.

10. The circuit of claim 8, wherein the hold circuit includes end-to-end coupled inverters having a state that is determined by the first type transistor when the first transistor conducts and that is determined by the second type transistor when the second transistor conducts.

11. The circuit of claim 8, wherein the hold circuit includes a hold transistor of the first type having a source and a drain that is coupled in parallel with the source and drain of the first transistor.

12. The circuit of claim 11, wherein the selector is arranged to control the gate of the hold transistor in response to the output signal of the BTI-resistant circuit.

13. The circuit of claim 8, wherein the first type is PMOS.

14. The circuit of claim 8, a hold circuit that is arranged to hold the output signal in the first state until an occurrence of the next first direction transition.

15. The circuit of claim 12, wherein the selector is arranged to detect the second direction transition and in response to the detection of the second direction transition to change the logic state of the gate of the second transistor before the occurrence of the next first direction transition.

16. The circuit of claim 8, wherein the circuit is arranged as a BTI-resistant standard cell.

\* \* \* \* \*